United States Patent [19]

Blanchandin et al.

[11] Patent Number: 4,555,675

[45] Date of Patent: Nov. 26, 1985

[54] DEVICE FOR COMPENSATING TEMPERATURE DRIFTS OF THE GAIN OF AN ULTRA-HIGH FREQUENCY ELECTRIC SIGNAL AMPLIFIER

[75] Inventors: Monique Blanchandin, Neuilly sur Seine; Roland Girardat, Andresy; Jean-Michel Vanestrenvord, Levallois-Perret, all of France

[73] Assignee: Thomson CSF, Paris, France

[21] Appl. No.: 569,711

[22] Filed: Jan. 10, 1984

[30] Foreign Application Priority Data

Jan. 21, 1983 [FR] France .................................. 83 00914

[51] Int. Cl.[4] ............................................. H03F 3/04
[52] U.S. Cl. ..................................... 330/289; 330/277
[58] Field of Search ........................ 330/277, 289, 266

[56] References Cited

U.S. PATENT DOCUMENTS 4,442,410  4/1984  Daniel ................................. 330/289

Primary Examiner—James B. Mullins
Assistant Examiner—G. Wan
Attorney, Agent, or Firm—Cushman, Darby & Cushman

[57] ABSTRACT

A device for compensating the temperature drifts of the gain of an ultra-high frequency electric signal amplifier, having a bi-gate field effect transistor coupled by a first gate to the ultra-high frequency signal source and by its output to the input of the amplifier. It also comprises a temperature sensor coupled to the second gate of the bi-gate transistor for controlling the gain of the bi-gate transistor as a function of the temperature variations.

8 Claims, 5 Drawing Figures

DEVICE FOR COMPENSATING TEMPERATURE DRIFTS OF THE GAIN OF AN ULTRA-HIGH FREQUENCY ELECTRIC SIGNAL AMPLIFIER

BACKGROUND OF THE INVENTION

1. Field of the Invention

The invention relates to a device for compensating the temperature drifts of the gain of an ultra-high frequency electric signal amplifier.

2. Description of the Prior Art

It is known to stabilize the gain of an amplifier by means of a regulation loop. According to this process, a part of the output power of the amplifier is taken off by means of a coupler and is applied to the input of a detector, formed generally by a detection diode whose drift is temperature compensated and which delivers a DC voltage to a first input of a comparator. A threshold or reference DC voltage is applied to the second input of the comparator. The output of the comparator delivers an error signal whose amplitude is proportional to the difference between the detected voltage and the threshold or reference voltage. The error signal obtained acts on the attenuation ratio of an attenuator placed in the amplification chain, so that the power level at the output of the amplifier is held constant whatever the variations of the temperature.

A problem however arises when the amplifier transmits simultaneously several frequencies with variable frequency differences, for in this case the voltage at the output of the detector no longer varies solely as a function of the temperatures variations but also as a function of the different transmitted frequencies, and accordingly it is no longer possible to compensate directly the variations in gain due to the temperature by the voltage delivered by the detector.

It is also known to stabilize the gain of an amplifier by acting directly on the biasing values of the amplifier transistors. This process consists, for example, in compensating the temperature drift of a field effect transistor by applying a correction voltage to the control gate of the transistor, which causes a variation of the drain current and thus a gain variation. To implement this process, it is sufficient to choose a temperature responsive element which acts correctly on the biasing voltage of the gate of the transistor. However, this process which is applicable to low level transistors, working far from their saturation zones, is very difficult to put into practice with power field effect transistors. In fact, experience shows that the average drift of an amplifying chain of field effect transistors is substantially 0.015 decibels per degree centigrade multiplied by the number of stages forming the amplifier, which leads for example, for an amplifying chain with 8 cascade connected transistors subjected to temperature variations within a range for example of 100°, to a peak to peak drift of practically 12 decibels. Because of the great correction dynamics required, the processes for compensating by acting on the biasing of the transistors thus appear totally inefficient.

SUMMARY OF THE INVENTION

The aim of the invention is to overcome the above mentioned disadvantages.

For this, the invention provides a device for compensating the temperature drifts of the gain of an amplifier for ultra-high frequency electric signals supplied by an ultra-high frequency signal source, comprising a bi-gate field effect transistor connected by a first gate to the ultra-high frequency signal source and by its output to the input of the amplifier, and further comprising a temperature sensor coupled to the second gate of the bi-gate transistor for controlling the gain of the bi-gate transistor as a function of the temperature variations.

BRIEF DESCRIPTION OF THE DRAWINGS

Other features and advantages of the invention will also appear from the following description, made with reference to the accompanying drawings, given solely by way of example and in which;

FIG. 2 is a graph showing the variations of the gain of the bi-gate transistor as a function of the control voltage applied to its second gate.

DESCRIPTION OF THE PREFERRED EMBODIMENT

Figure 1:
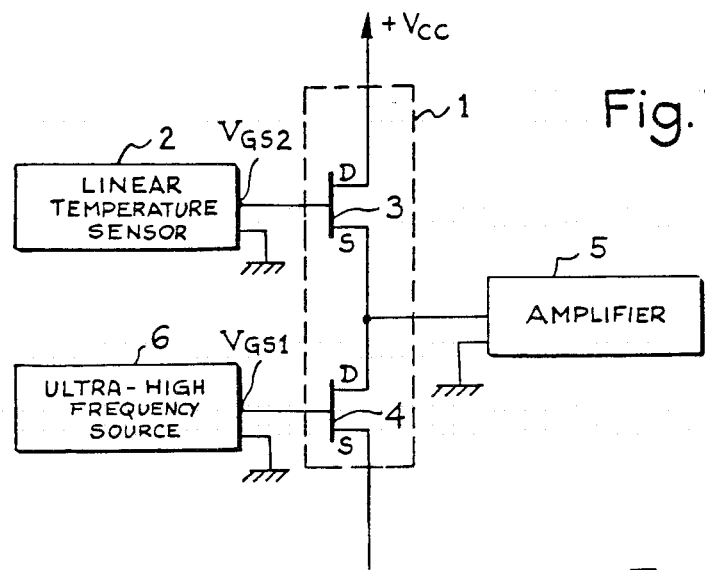
FIG. 1 shows the block diagram of the device of the invention coupled between an amplifier chain and a ultra-high frequency signal source.

The device of the invention, as shown in FIG. 1, comprises a bi-gate field effect transistor 1, as well as a linear temperature sensor 2. The bi-gate transistor 1 is of a known type and is formed by two gates inserted between a source electrode and a drain electrode. A transistor of this type is more especially commercialized under the name NE 46 385 by the Japanese firm "Nippon Electric Company" known under the abbreviation NEC. For better understanding its operation, the bi-gate transistor 1 is shown in FIG. 1 by means of an equivalent diagram comprising two cascade connected transistors 3 and 4. The output of transistor 1 is formed by the common connection point between the drain of transistor 4 and the source of transistor 3. The output of transistor 1 is connected to the input of an ultra-high frequency amplifier 5. The gate of transistor 4, playing the role of first gate for transistor 1, is connected to the output of an ultra-high frequency source 6. The source electrode of transistor 4 is connected to the general ground of the device. The gate of transistor 3, playing the role of second gate for transistor 1, is connected to the output of the temperature sensor 2. The drain of transistor 3 is biased to a voltage $+V_{CC}$ by a supply source not shown external to the device.

The evolution of the gain of the bi-gate transistor 1 corresponding to the ratio between the level of the outgoing signal from transistor 1 and the level of the incoming signal supplied by the ultra-high frequency source 6, as a function of the gain control DC voltage applied to the second gate of the transistor 1 by the temperature sensor 2 is shown by means of the graph of FIG. 2. In this graph, the curves shown correspond to measurements of the gain of a transistor NE 56385, biased on its first gate (gate of transistor 4) by a DC voltage $V_{GS1}$ of $-2.45$ Volts, supplied by a $+4$ Volt voltage $V_{CC}$ and a drain current $I_{Do}$ of 10 mA. The values $V_{GS2}$ of the DC voltage applied to the second gate of transistor 1 are shown in abscissa and the corresponding gain values $G=f(V_{GS2})$ are shown in ordinates. According to this graph, the gain of the bi-gate transistor varies from $-15$ dB to about $+8$ dB for a variation of the voltage $V_{GS2}$ from to 0 to about $-3$ Volts, whatever the frequencies of the signals transmitted between 5.85 GHz and 6.425 GHz.

Figure 3:
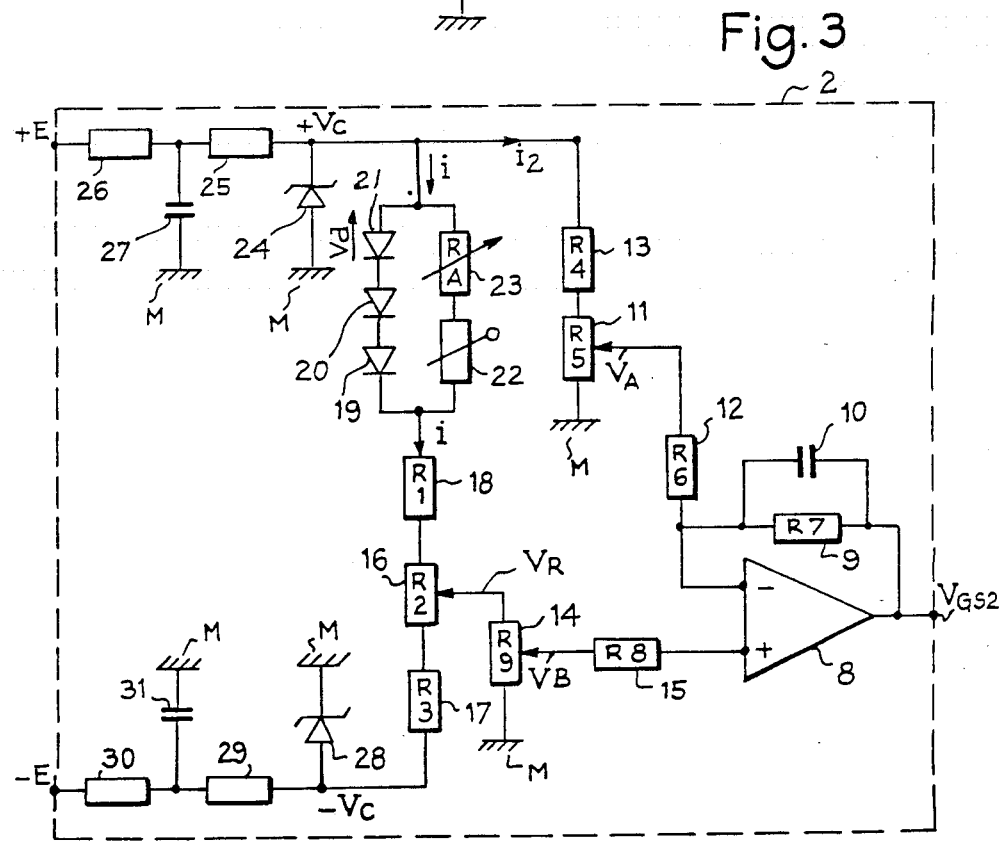
FIG. 3 is a representation of the linear temperature sensor used for constructing the device shown in FIG. 1.

The temperature sensor, shown in FIG. 3, comprises a differential operational amplifier 8 comprising an input marked "+" and an input marked "−" and delivering at its output the signal $V_{GS2}$ for controlling the gate of the field effect transistor 3. The output of the operational amplifier 8 is relooped to the input marked "−" through a resistor 9, designated also by $R_7$, connected in parallel across an integration capacitor 10. The input marked "−" of amplifier 8 is also connected to the slider of a potentiometer 11 through a resistor 12, also designated by $R_6$. One end of potentiometer 11 is connected to the general supply ground M of the common sensor also with the general ground M of the device and the other end is connected to a reference supply providing a positive voltage $+V_C$ through a resistor 13, also designated by $R_4$. The input marked "+" of the amplifier 8 is connected to the output of a slider of a potentiometer 14, also designated by $R_9$, through a resistor 15, also designated by $R_8$. One end of the potentiometer 14 is connected to the general supply ground M of the sensor. The other end of potentiometer 14 is connected to the slider of a potentiometer 16, also designated by $R_2$, one end of which is connected to a reference voltage source $-V_C$ through a resistor 17 also designated by $R_3$, and whose other end is connected to the supply source delivering the reference voltage $+V_C$ through a resistor 18, also designated by $R_1$ and diodes 19, 20, 21 connected in series. The common point connecting the end of resistor 18 to the cathode of diode 19 is also connected to the output of the supply source delivering the reference voltage $+V_C$ through an element 22 varying as a function of the temperature such as a thermistor or any other equivalent means and a variable resistor 23, also designated by RA, connected in series. The supply source delivering the reference voltage $+V_C$ is formed by a Zener diode 24 whose anode is connected to the general supply ground M of the sensor and whose cathode is supplied with a supply voltage $+E$ provided by a power supply generator external to the sensor, not shown, through a resistor 25 and a resistor 26 both connected in series. The common point between resistors 25 and 26 is connected to the general supply ground M of the sensor through capacitor 27. In a substantially identical way, the reference voltage $-V_C$ is provided by a Zener diode 28 whose cathode is connected to the general supply ground M of the sensor and whose anode is connected to a supply source external to the sensor, not shown, providing a supply voltage $-E$ through a resistor 29 and a resistor 30 both connected in series. The common point between resistors 29 and 30 is connected to the general supply ground of the sensor by means of a capacator 31.

The operation of the temperature sensor which has just been described is as follows. The differential amplifier 8 amplifies the difference between the voltages $V_A$ and $V_B$ obtained respectively on the sliders of potentiometers 11 and 12 and supplies the voltage $V_{GS2}$ for controlling the second gate of the bi-gate transistor 1. The voltage $V_{GS2}$ obeys the relationship $$V_{GS2} = G(V_B - V_A) \qquad (1)$$

where $$G = \frac{R_7}{R_6} \qquad (2)$$

The voltage $V_A$ is adjusted by potentiometer 11 to a fixed positive value which is related to the stabilized voltage $+V_C$ obtained at the terminals of the Zener diode 24 by the relationship $$V_A = \frac{K_1 R_5}{R_4 + R_5} V_c \qquad (3)$$

where $K_1$ is the potentiometric ratio of potentiometer 11.

The voltage $V_B$ on the other hand is variable depending on the temperature, for it is derived from the potential difference $V_R$ existing between the potential of the slider of potentiometer 16 and the general supply ground M of the sensor, this potential difference varying as a function of the voltage which appears at the terminals of each of diodes 19 to 21. In fact, at ordinary temperature 25° C., the voltage at the terminals of the diode is about 0.7 volt and this voltage decreases when the ambient temperature increases. The decrease of voltage $V_d$ is about 100 millivolts when the temperature reaches about 85° C. Conversely, when the ambient temperature decreases, the voltage $V_d$ at the terminals of the diode increases. With the help of the elements of the diagram of FIG. 3, a simple calculation is sufficient to determine the variations of the potential difference $V_R$ or of the voltage $V_R$, as a function of the variations of voltage $V_d$ at the terminals of each of the diodes. At any ambient temperature, if i designates the current flowing in resistor $R_1$, it is possible to write the relationship $$2V_c = 3V_d + (R_1 + R_2 + R_3)i \qquad (4)$$

and $$i = \frac{2V_c - 3V_d}{R_1 + R_2 + R_3} \qquad (5)$$

assuming in this example that the current $i_2$ flowing in resistors $R_4$ and $R_5$ and the current $i_3$ flowing in resistor $R_9$ are negligeable with respect to current i.

The relationship (5) further allows the following relationship to be written $$V_R = V_c - 3V_d - (R_1 + kR_2)\frac{2V_c - 3V_d}{R_1 + R_2 + R_3} \qquad (6)$$

If, with respect to any ambient temperature, the temperature measured by diodes 19 to 21 decreases, the voltage at the terminals of each of the diodes increases by $+\Delta V_d$ and the equation (6) becomes $$V_R + \Delta V_R = V_c - 3(V_d + \Delta V_d) - \qquad (7)$$

$$(R_1 + kR_2)\left[\frac{2V_c - 3(V_d + \Delta V_d)}{R_1 + R_2 + R_3}\right]$$

which gives $$\Delta V_R = -3\Delta V_d \left( \frac{R_2(1-K) + R_3}{R_1 + R_2 + R_3} \right) \quad (8)$$

Since $K<1$, $1-K$ is positive.

Consequently, the voltage $V_R$ becomes more negative, while varying proportionally to the voltage $V_d$ at the terminals of the diode, when the temperature decreases.

Setting of the device shown in FIG. 3 may be effected in the following way.

At an ambient reference temperature, for example at 25° C., potentiometer 16 is adjusted so as to supply a 0 voltage $V_R$ and consequently so as to obtain a 0 voltage $V_B$ on the slider of potentiometer 14. Potentiometer 11 is then adjusted so as to obtain a voltage $V_{GS2}$ at the output of amplifier 8 of about $-2.9$ volt, which according to the diagram of FIG. 2 controls the attenuation of the bi-gate transistor 1 to an attenuation of $-6$ dB.

When the ambient temperature drops below 25° C., the voltage $V_{GS2}$ which follows the variations of voltage $V_B$ in the ratio of resistors 9 and 12 becomes more negative, which causes a greater attenuation control of the bi-gate transistor 1 which compensates for the corresponding increase in gain of amplifier 5. This compensation may be very accurately balanced for a precise setting of potentiometer 14 providing the voltage $V_B$. In the opposite case, when the ambient temperature rises above 25° C., the voltage $V_{GS2}$ becomes more positive, causing a smaller attenuation of the bi-gate transistor which compensates for the reduction in gain of the amplifier 5. The variation in gain of the bi-gate transistor controlled by sensor 2 which has just been described is shown in FIG. 4 for a transmission frequency of 6.1 GHz.

Figure 4:
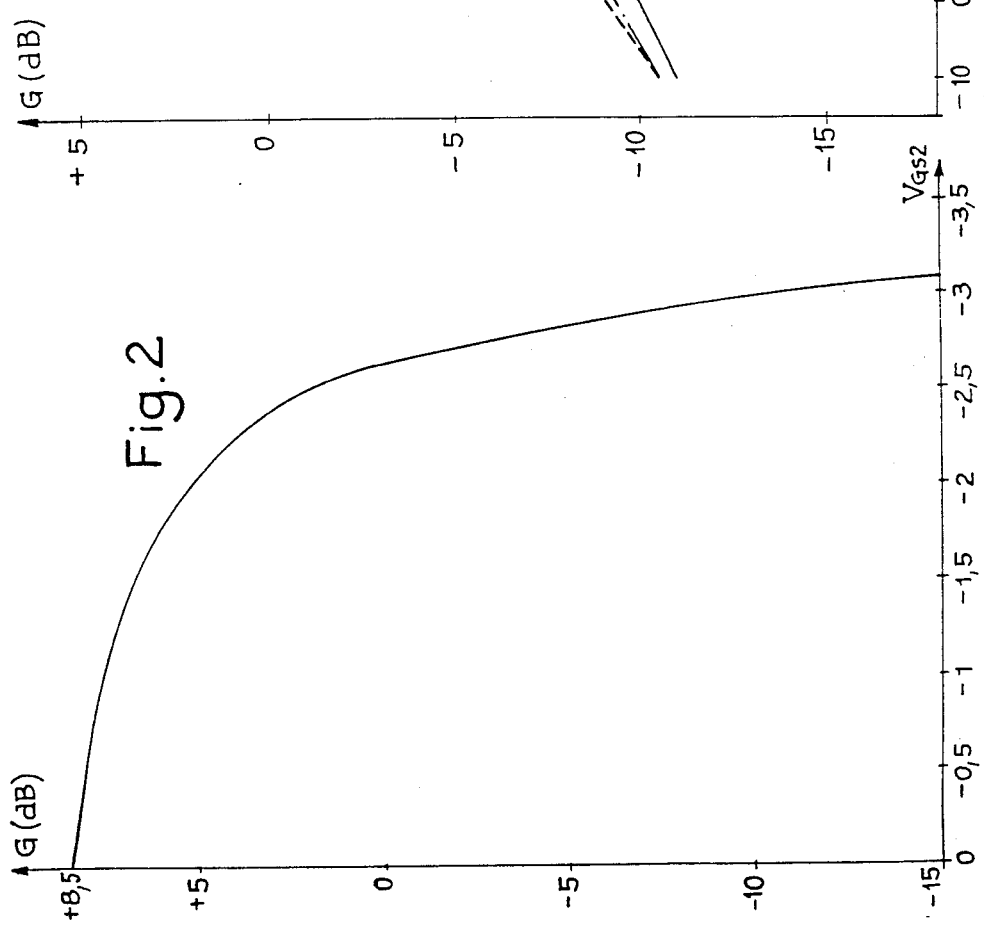
FIG. 4 is a curve showing the variations of the gain of the bi-gate transistor driven by the temperature sensor.

In FIG. 4, it can be seen that a substantially linear gain variation is obtained between $-10°$ C. and $+70°$ C., respectively, from $-11$ dB to about $+1$ dB when resistor 23 has a zero value, from $-10.5$ dB to about $-3$ dB when resistor 23 has a value between 100 and 200 Ω.

The result obtained presents greater dynamics when resistor 23 has a zero value, for in this case resistor 23 makes the role of thermistor 22 more efficient. In fact, when the ambient temperature is high, the resistance of the thermistor decreases and its influence is no longer negligeable with respect to that of the three diodes 19, 20, 21. That allows the gate of the field effect transistor to be made less negative and the curvature of the characteristic of the gain to be compensated for as a function of the voltage $V_{GS2}$ controlling the bi-gate transistor shown in FIG. 2. This result may be improved to a greater or lesser degree depending on the value of resistor 23 inserted in series with the thermistor 22.

Figure 5:
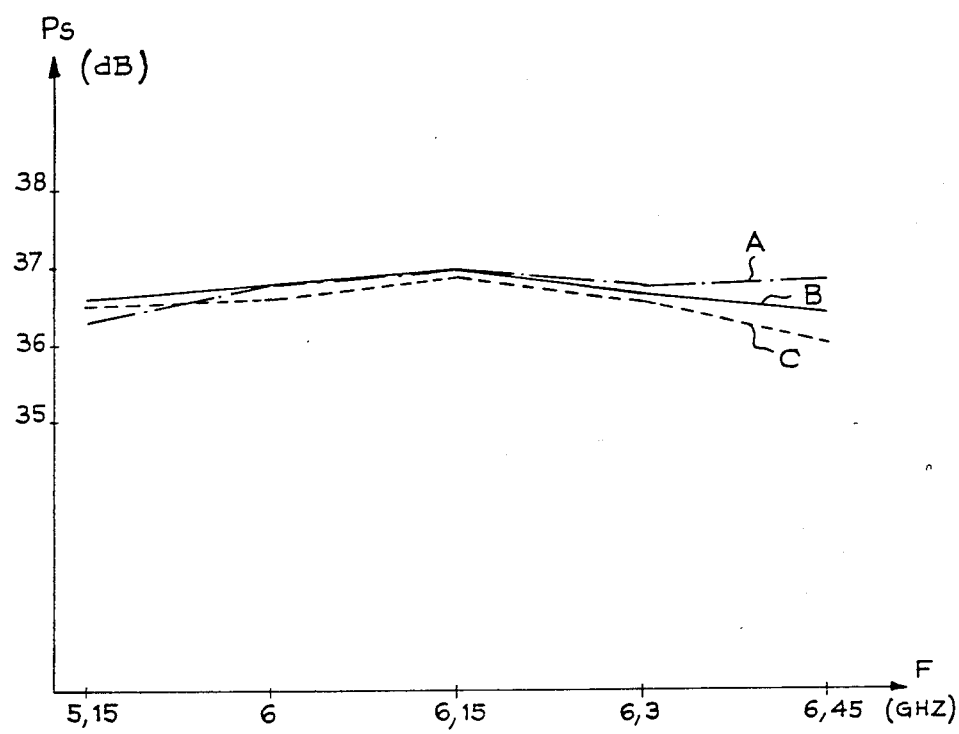
FIG. 5 is a graph, showing the evolution of the output power of the amplifier as a function of the frequency of the signals applied by the ultra-high frequency signal source, through the device of the invention.

The graph shown in FIG. 5 shows results of measurements carried out on an ultra-high frequency amplifier temperature-compensated by means of a device of the invention. It can be seen in the Figure that the output power supplied by amplifier 5 is held practically constant for temperature variations between $-10°$ C. and $+55°$ C. and for operating frequencies between 5.15 GHz and 6.45 GHz. Curve A shows the evolution of the gain as a function of the frequency for a temperature of $-10°$ C. Curve B shows the evolution of the gain as a function of the frequency for a temperature of 25° C. and curve C shows the evolution of the gain as a function of the frequency for a temperature of $+55°$ C.

Although the principles of the present invention have been described above with reference to a particular embodiment, it should be understood that the description has only been given by way of example and in no wise limits the scope of the invention.

We claim:

1. A device to compensate for temperature drift in the gain of an amplifier which amplifies ultra-high frequency signals generated by an ultra-high frequency signal source, comprising:
    a bi-gate field effect transistor with a gain and having an output adapted for connection to said amplifier, a first input adapted for connection to said ultra-high frequency source, and a second input; and
    linear temperature sensor means, coupled to said bi-gate transistor second input, for controlling said bi-gate transistor gain as a function of temperature variations.

2. The device as claimed in claim 1 wherein said bi-gate transistor gain is controlled so as to vary linearly as a function of temperature.

3. The device as claimed in claim 2, wherein said temperature sensor means acts on said bi-gate transistor so as to increase the gain of said bi-gate transistor when the temperature increases.

4. A device according to claim 3 wherein said temperature sensor means includes:
    first means, having an output, for providing a variable voltage which varies as a function of temperature;
    second means for producing a fixed reference voltage; and
    differential amplifier means, having a first input coupled to said first means output and a second input coupled to said second means and an output coupled to said bi-gate transistor second input, for controlling said bi-gate transistor gain as a function of a difference existing between said variable voltage and said fixed voltage.

5. The device as claimed in claim 4 wherein said first means includes a plurality of series connected diodes.

6. The device as claimed in claim 4 wherein said first means includes a plurality of series connected diodes coupled in parallel to at least one element which varies as a function of temperature.

7. The device as claimed in claim 6, wherein said first means further include means for adjusting said variable voltage to obtain a zero voltage at said first means output at a reference ambient temperature.

8. The device as claimed in claim 4 wherein said second means includes means for regulating said reference voltage to adjust said bi-gate transistor gain to any value at a reference ambient temperature.

* * * * *